US009825617B2

(12) United States Patent
De Geeter et al.

(10) Patent No.: US 9,825,617 B2
(45) Date of Patent: Nov. 21, 2017

(54) INDUCTIVE LOAD DRIVER SLEW RATE CONTROLLER

(71) Applicant: Microchip Technology Incorporated, Chandler, AZ (US)

(72) Inventors: Bart De Geeter, Lausanne (CH); Nicolas Furrer, Boudry (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/095,896

(22) Filed: Apr. 11, 2016

(65) Prior Publication Data

US 2016/0226472 A1    Aug. 4, 2016

Related U.S. Application Data

(63) Continuation of application No. 14/200,266, filed on Mar. 7, 2014, now Pat. No. 9,312,852.
(Continued)

(51) Int. Cl.
*H03K 5/12* (2006.01)
*H03K 5/04* (2006.01)
(Continued)

(52) U.S. Cl.
CPC ............ *H03K 5/04* (2013.01); *H03K 17/166* (2013.01); *H03K 17/167* (2013.01);
(Continued)

(58) Field of Classification Search
CPC ........ H03K 17/6871; H03K 19/00361; H03K 19/00384; H03K 5/12
(Continued)

(56) References Cited

U.S. PATENT DOCUMENTS 4,090,126 A * 5/1978 Poticha ................. G01R 23/14
                                                        324/604
5,739,715 A * 4/1998 Rawson ............... H03K 17/165
                                                        326/17
(Continued)

FOREIGN PATENT DOCUMENTS

TW          201041308 A    11/2010    ......... H03K 19/0185

OTHER PUBLICATIONS

Balogh, Laszlo, "Design and Application Guide for High Speed MOSFET Gate Drive Circuits," Texas Instruments/Unitrode Corporation, Proc. Power Supply Design Seminar (SEM 1400), 37 pages, 2001.
(Continued)

*Primary Examiner* — Thomas Skibinski
(74) *Attorney, Agent, or Firm* — Slayden Grubert Beard PLLC

(57) ABSTRACT

A circuit and method for digital controlling the slew rate of load voltage are provided. The circuit is comprised of a digital slew-rate control unit that utilizes a feedback signal to generate control signals where the feedback signal indicates the observed rate of voltage change on the load. The circuit is further comprised of a load driver circuit that is operated by the control signals and provides a slew-rate controlled output voltage used to operate a load switch, where the load switch provides power to the load. The circuit is configured to operate the load switch using a slew-rate controlling driver, depending on the state of the load switch transition, and a non-controlling driver.

23 Claims, 7 Drawing Sheets

Related U.S. Application Data

(60) Provisional application No. 61/775,523, filed on Mar. 9, 2013.

(51) Int. Cl.
*H03K 17/687* (2006.01)
*H03K 17/16* (2006.01)

(52) U.S. Cl.
CPC . *H03K 17/6871* (2013.01); *H03K 2217/0063* (2013.01); *H03K 2217/0072* (2013.01)

(58) Field of Classification Search
USPC ........ 327/170, 172–176, 108–112, 427, 434, 327/437; 326/82, 83
See application file for complete search history.

(56) References Cited

U.S. PATENT DOCUMENTS

| | | | |
|---|---|---|---|
| 5,926,012 A * | 7/1999 | Takizawa | H03K 17/0828 323/284 |
| 6,768,363 B2 | 7/2004 | Yoo et al. | 327/170 |
| 7,498,844 B2 | 3/2009 | Rho | 326/86 |
| 7,668,021 B2 | 2/2010 | Yun | 365/189.05 |
| 7,737,728 B1 | 6/2010 | Truong et al. | 326/83 |
| 7,924,056 B2 | 4/2011 | Kumar et al. | 326/83 |
| 8,331,072 B1 | 12/2012 | Liu et al. | 361/93.9 |
| 9,312,852 B2 | 4/2016 | De Geeter et al. | H03K 17/6871 |
| 2001/0026178 A1 | 10/2001 | Itoh et al. | 327/112 |
| 2012/0007637 A1* | 1/2012 | Fukuda | H02M 3/1588 327/110 |

OTHER PUBLICATIONS

International Search Report and Written Opinion, Application No. PCT/US2014/021851, 10 pages, Jun. 18, 2014.

Taiwan Office Action, Application No. 103108215, 6 pages, dated Aug. 28, 2017.

* cited by examiner

US 9,825,617 B2

INDUCTIVE LOAD DRIVER SLEW RATE CONTROLLER

CROSS-REFERENCE TO RELATED APPLICATIONS

This application is a continuation of U.S. patent application Ser. No. 14/200,266 filed on Mar. 7, 2014, which claims the benefit of U.S. Provisional Application No. 61/775,523, filed on Mar. 9, 2013, which is incorporated herein in its entirety.

TECHNICAL FIELD

The present disclosure relates to a slew-rate controller for a load driver circuit; in particular, to a driver circuit for providing power to inductive loads, such as a motor or a switched-mode power supplies (SMPS).

BACKGROUND

A variety of modern electronics utilize load switches to control the delivery of power to loads that draw current from the available power supply, such as a motor or SMPS. Load driver circuits are used to exert control over a load switch. In addition to determining when the load switch provides power to a load, a load driver circuit may also control the rate at which properties of the load are changed. The rate at which these properties change is often referred to as a slew rate. Load switches are commonly implemented using MOSFETs, which provide precise control over the delivery of power to a load and over slew rates, such as the change in voltage on a phase node of a motor or the voltage drop on the inductance of an SMPS.

Once a determination has been made to switch power to a load, a load driver circuit is typically configured to power the load as quickly as possible. This maximizes efficiency in terms of minimizing the latency in powering the load, such that the component being powered can perform its intended function. However, practical limits exist on how quickly a load can be powered by a load driver circuit.

Many types of current loads (for instance, electric motors) are sources of impedance. The impedance of these loads cause problematic side effects that result from powering them. For example, in the case of a load that is a motor, the load current path is switched between being driven by a high-side and low-side driver, which results in the current path switching between supply and ground paths. This switching causes the voltage on the load to change quickly, which results in a kickback charge flowing back to the load switch. This kickback voltage can traverse the load switch, and can result in the unintended switching of the opposite load switch. This, in turn, has consequences ranging from reduced efficiency in benign cases to damage to the load driver circuit and/or the load switch.

In addition to kickback, powering a current load can result in electromagnetic interference (EMI) being generated. One particularly relevant source of EMI is the electromagnetic force that results from rapidly powering an inductive load, such as a motor or from the rapidly changing current in the supply and ground wires. The greater the rate of change of voltage powering the load, the greater the magnitude of the induced magnetic field, and the greater the levels of resulting EMI. Even modest amounts of EMI can result in spurious currents in the system that can cause malfunctions in neighboring circuitry and potentially even damage neighboring circuits.

Fast current changes through the switches will generate large voltage spikes due to the parasitic inductance on the current path. These large spikes can exceed switch and driver circuit safe operating limits and damage parts.

In general, these problems caused by the application of power to a load can be ameliorated by slowing the rate at which the voltage on the load changes. Moderating the rate at which voltage on the load changes results in a decrease in kickback and the generation of EMI.

Changing the voltage on a load more slowly can at least partially alleviate some of these problems, but it introduces an undesirable inefficiency into the system. By delaying the time required to reach the supply voltage (or ground, depending on whether the load is being switched on or off), this introduces a latency in the response time of the load. Any such delays accumulate over time and cause unacceptable inefficiencies that ripple throughout the system. Thus, it is desirable to apply a voltage to a load, such as a motor, at a rate that minimizes the latency in the response time for the load, yet does not produce undesirable levels of kickback current and EMI.

SUMMARY

Conventional driver circuits provide inadequate slew-rate control due to their dependence on environmental properties, and they are open-loop solutions that do not take into account observations of the value being controlled. Hence, there is a need for a closed-loop solution that provides more accurate and reliable control of slew rates. These and other drawbacks in the prior art are overcome in large part by a system and method according to embodiments of the present invention.

According to an embodiment, an integrated circuit is provided for driving a first load switch, wherein the first load switch powers an inductive load, the integrated circuit comprising: a first digital slew-rate control unit for generating control signals, wherein the first digital slew-rate control unit generates the control signals based on a feedback signal that indicates the rate of voltage change on the load; and a first load driver circuit operated by the control signals wherein the first load driver circuit generates a slew-rate controlled output voltage that operates the first load switch.

According to further embodiments the first load switch is a MOSFET. According to further embodiments, the integrated circuit is a slew-rate control driver; and the integrated circuit further comprises a non-control driver that generates a constant output, wherein the load switch is operated by the non-control driver and the slew-rate control driver, and wherein the slew-rate control driver generates a constant output during steady states of the load switch, and wherein the slew-rate control driver is modulated to generate a slew-rate controlled output during state transitions of the load switch. According to further embodiments, the slew-rate controlled driver is a large low-impedance driver, and the non-control driver is a small current limited driver. According to further embodiments, the integrated circuit is a low-side driver and the first load switch is a low-side load switch, and the integrated circuit further comprises: a second digital slew-rate control unit for generating high-side control signals, wherein the second digital slew-rate control unit generates the control signals based on the feedback signal that indicates the rate of voltage change on the load; and a second load driver circuit operated by the high-side control signals, wherein the second load driver circuit generates a slew-rate controlled output voltage that operates the second load switch, wherein the second load driver circuit and the second digital slew-rate control unit comprise a high-side driver. According to further embodiments, the first digital slew-rate control unit comprises a capacitor that receives the feedback signal; and a resistor coupled with the capacitor that defines the slew rate. According to further embodiments, the first digital slew-rate control unit further comprises: a NAND gate having a first input receiving the feedback signal and a second input receiving an input voltage signal, wherein the output of the NAND gate controls a p-channel field-effect transistor of the first load driver circuit; and a NOR gate having a first input receiving the feedback signal and a second input receiving the input voltage signal, wherein the output of the NOR gate controls an n-channel field-effect transistor of the first load driver circuit.

BRIEF DESCRIPTION OF THE DRAWINGS

The present invention may be better understood, and its numerous objects, features, and advantages made apparent to those skilled in the art, by referencing the accompanying drawings. The use of the same reference symbols in different drawings indicates similar or identical items.

DETAILED DESCRIPTION

Figure 1:
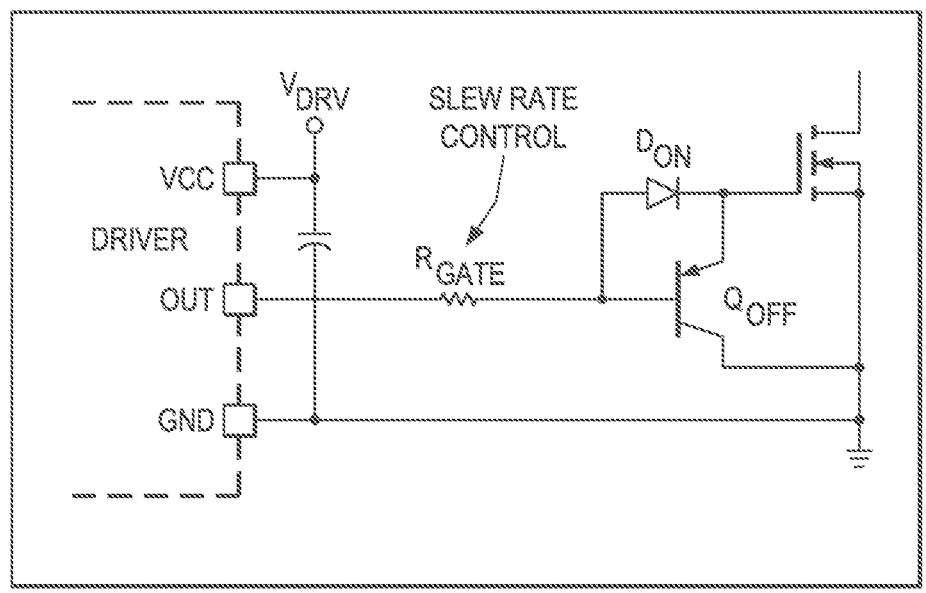
FIG. 1 shows a load drive circuit implementing conventional slew-rate control.

FIG. 1 illustrates conventional slew-rate control of a load driver circuit using a resistor $R_{GATE}$ in series between the load driver circuit and the load switch. The use of a series resistor in this manner serves to moderate the rate at which the voltage on the load, $V_{DS}$, is changed, which reduces the amount of EMI and mitigates the kickback generated by rapid changes in the output voltage used to drive the current load. The use of a series resistor for moderating the slew rate of a load switch provides inadequate control over the rate at change of the voltage on the load because the resistor's behavior varies according to the operating temperature of the system and because the resistor fails to account for tolerance variations in the load switch—which can be significant when transistor load switches such as MOSFETs are used—or the actual current drawn by the load. Furthermore, conventional, resistor-based slew-rate control is an open-loop solution that must be designed based on predictions of the circuit's behavior and is unable to account for actual operational characteristics of the circuit.

The series resistor used to limit the slew rate makes the switches more susceptible to kickback and results in the need for conventional kickback prevention circuits, such as that depicted in FIG. 1. They utilize a bipolar transistor $Q_{OFF}$ that is switched to an on state in order to provide a low impedance pathway by which to discharge a kickback voltage. The low impedance path provided by the bipolar transistor, $Q_{OFF}$, allows the kickback current to be sunk, while keeping the kickback charge from reaching the gate terminal of the load switch. An additional diode is required to turn on the bipolar transistor and create the charging path to the load switch gate. This conventional circuitry for kickback prevention is undesirable, as it adds manufacturing cost and space requirements. These disadvantages could be avoided by a load driver that is capable of delivering power in a manner that reduces kickback and has low enough output impedance to sink the remaining kickback current.

Figure 2:
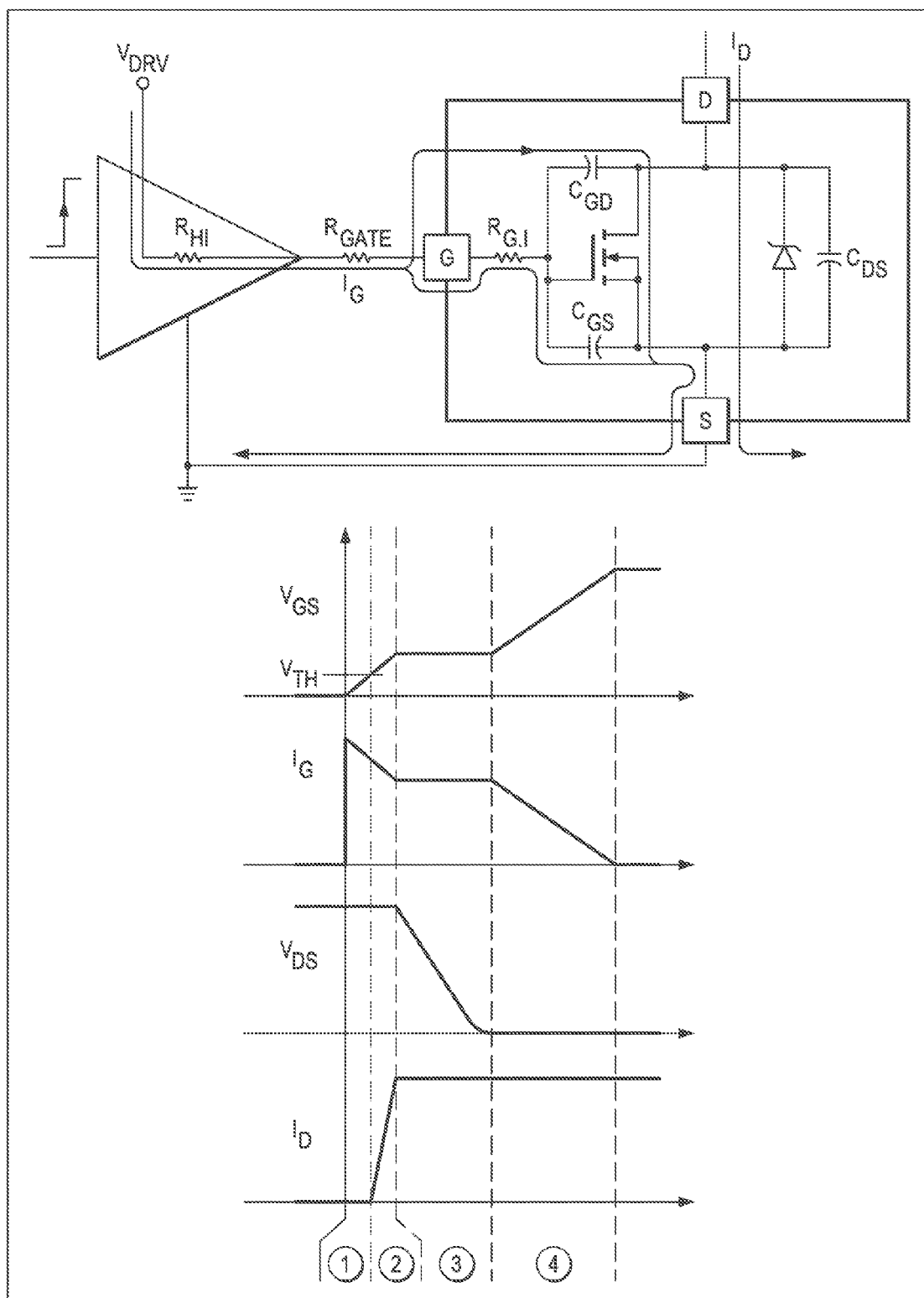
FIG. 2 shows timing of a conventional slew-rate control when turning on the MOSFET.
Figure 3:
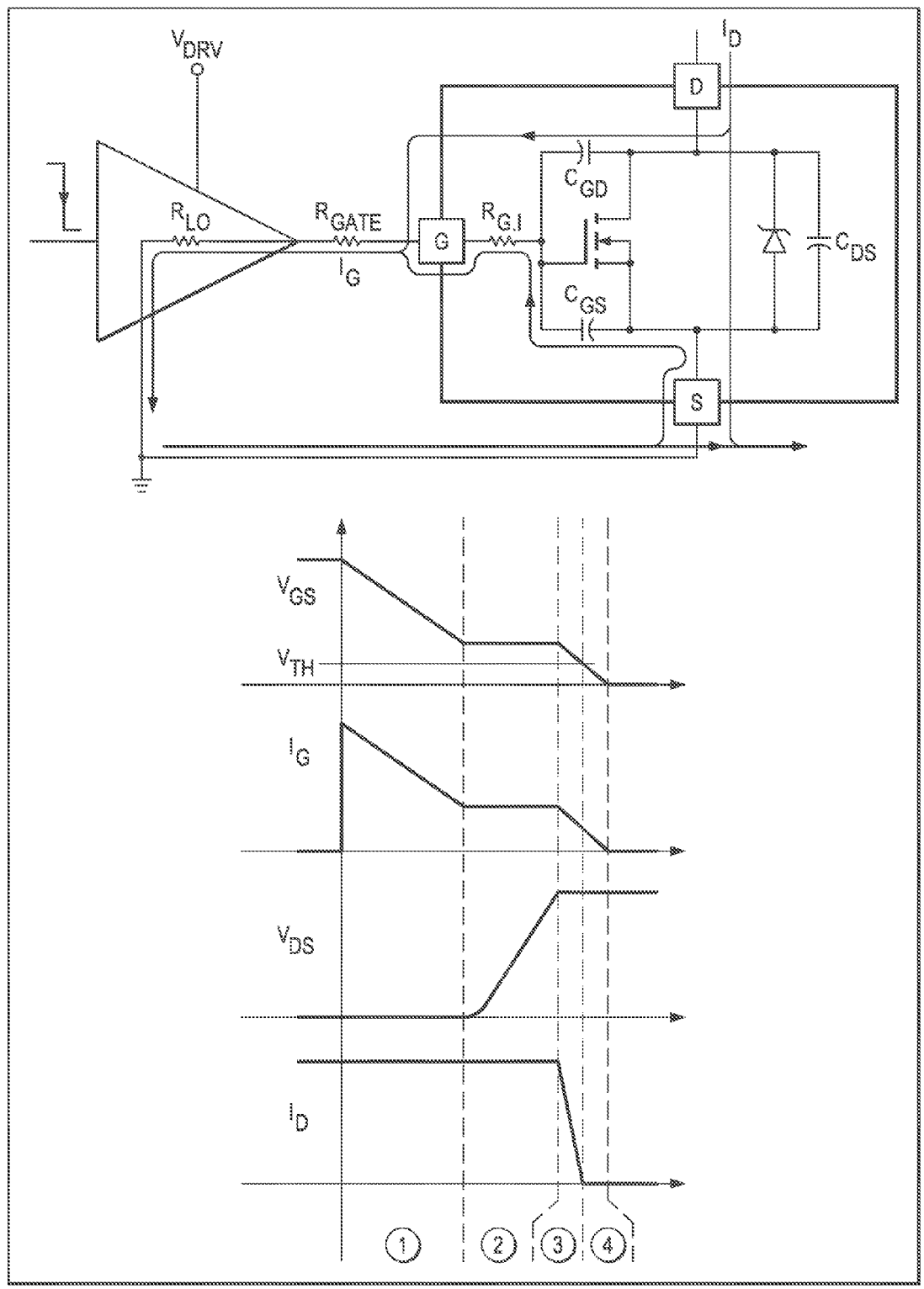
FIG. 3 shows timing of a conventional slew-rate control when turning off the MOSFET.

FIGS. 2 and 3 provide a more detailed view of a conventional load driver circuit that utilizes a series resistor to moderate the slew rate of a MOSFET load switch. FIGS. 2 and 3 are excerpted from *Design and Application Guide for High Speed MOSFET Gate Drive Circuits*, Laszlo Balogh, Unitrode Power Supply Seminar (2001), which describes a conventional load driver circuit. At the top of FIG. 2, a circuit diagram for conventional slew-rate control using a series resistor $R_{GATE}$ is depicted. The timing diagram at the bottom of FIG. 2 shows the changes to various MOSFET parameters when the MOSFET is being switched to an on state.

Period 1 of the timing diagram of FIG. 2 is known as the turn-on delay and represents the time that is required to raise the gate voltage, $V_{GS}$, from the off-state drive voltage to the threshold voltage, $V_{TH}$, at which the MOSFET begins to switch to an on state. The duration of period 1 is a function of the MOSFET's internal capacitance. The initial increase in the gate voltage during period 1 results from the charging of the MOSFET's internal capacitors. Since every MOSFET will have some internal capacitance, this turn-on delay represented in period 1 cannot be eliminated entirely. However, conventional load drive circuits that utilize a series resistor, $R_{GATE}$, introduce additional period 1 delay in the time required to load the internal load switch gate capacitor of the MOSFET and raise the gate voltage to the threshold voltage. The delay is due to the drop in the input voltage proportional to the MOSFET's internal capacitors charging current that is caused by this resistor. During the delay of period 1, the drain current, $I_D$, remains at an off level, and the drain voltage, $V_{DS}$, remains in a high state, since no charge is being conducted by the MOSFET at this time.

Period 2 of the timing diagram of FIG. 2 is the period during which the threshold voltage has been reached and the MOSFET begins to conduct charge. In period 2, the gate voltage is raised further past the threshold voltage, and the MOSFET begins to conduct a drain current. Thus, during period 2, the drain current goes from on off level to the full load current. This is the linear portion of the MOSFET's operation, where the drain current is a function of the gate voltage. The faster the gate voltage is raised during this interval, the more quickly the drain current increases. During period 2, the drain voltage remains at a high output voltage level because the low-side switch cannot yet sink the load current.

During period 3 of the timing diagram of FIG. 2, the drain current has reached the full, steady-state load current. Consequently, the MOSFET drain voltage is dropped to its low, on-state level. In the conventional system of FIG. 2, the rate at which the drain voltage is dropped is moderated by series resistor, $R_{GATE}$, in the gate terminal path. However, this open-loop, series resistor approach provides no capacity by which to adapt changes in gate voltage based on the actual rate of change of the drain voltage and, thus, provides inadequate ability to control kickback or EMI. Failure by the series resistor to adequately slow the rate of change of the drain voltage results in kickback, which may turn on the opposite side load switch of the bridge and consequently cause large shoot-through currents.

During period 4, the gate voltage of the MOSFET is raised to its on-state, drive voltage. During period 4, the MOSFET semiconductor is fully charged, such that it reaches its lowest resistance. Like period 1, the length of period 4 is also undesirably lengthened by the use of a series resistor.

FIG. 3 illustrates the timing diagram for switching this same MOSFET of FIG. 2 to an off state. The top of FIG. 3 repeats the previous circuit diagram of a conventional slew-rate control implementation using a series resistor $R_{GATE}$.

Period 1 of the timing diagram of FIG. 3 is known as the turn-off delay and represents the time required to drop the gate voltage, $V_{GS}$, from the on-state drive voltage to the voltage at which the MOSFET actually begins switching to an off state. This delay of period 1 in dropping the gate voltage is a result of the MOSFET's internal capacitance. When the load driver circuit drops the voltage supplied to the gate terminal, the rate at which the gate voltage actually drops depends on the time it takes for the internal capacitance of the MOSFET to discharge. As with the turn-on delay, the MOSFET's internal capacitance prevents eliminating turn-off delay entirely. However, a conventional load drive circuit that utilizes a series resistor lengthens this turn-on delay by limiting the current that can flow to discharge the MOSFET gate capacitor, $C_{GS}$. During the delay of period 1, the drain current, $I_D$, remains at the full load current and the drain voltage, $V_{DS}$, remains at its low state.

Period 2 of the timing diagram of FIG. 3 is the counterpart to period 3 of the MOSFET turn-on sequence and is the period during which the slew rate of the MOSFET is controlled during its turn-off sequence. During period 2 of the timing diagram of FIG. 3, the drain voltage, $V_{DS}$, of the MOSFET rises to its high, off-state voltage, since the load current is no longer being drawn. Current now accumulates in the $C_{DS}$ capacitor, which serves to increase the drain voltage. As before, failure by the series resistor to adequately slow the rate of change of the drain voltage results in kickback. During period 2, the drain current remains at the full load current.

As with the turn-on sequence, the series resistor, $R_{GATE}$, used in the conventional load drive circuit of FIG. 3 again provides only basic moderation of the rate of change in the drain voltage during period 2 of the turn-off sequence. As the input voltage supplied by the load driver to the gate terminal is decreased, the series resistor $R_{GATE}$ resists this change by limiting current flow. This, in effect, lengthens the duration of period 2. However, as before, this slew-rate control provides only basic, open-loop control of the gate voltage that is designed based on worst-case predictions of the circuit's operations, and with no input regarding the actual current at the load, resulting in inefficient switching times. And, as before, spikes and kickback voltage can still result from rapidly decreasing the gate voltage and drain current beyond the serial resistor's designed ability to moderate this change.

During period 3, the switch gate voltage is further discharged to the switch threshold, reducing the drain current to zero. During period 4 of the timing diagram of FIG. 3, the remaining internal capacitance of the MOSFET is discharged as the gate voltage drops to its low, off-state level. During period 4, the drain current and drain voltage are at steady-state, off levels. Like period 1, the length of periods 3 and 4 are also undesirably lengthened by the use of a series resistor.

Provided further below is a comparison of these conventional slew-rate control timing diagrams, depicted in FIGS. 2 and 3, to timing diagrams generated using an embodiment of the claimed invention. It illustrates the additional time delay caused by the use of a series resistor for slew-rate control, and the improvements provided by the invention.

Figure 4:
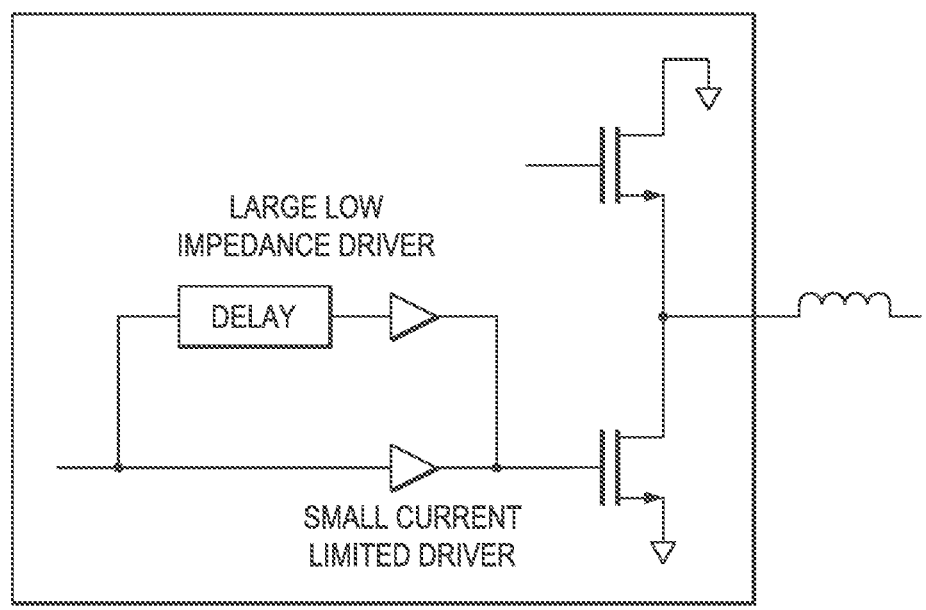
FIG. 4 shows another conventional load drive circuit implementing slew-rate control.

FIG. 4 illustrates a MOSFET load drive circuit according to some embodiments. This load drive circuit is actually formed from two distinct load drive circuits. One is a large low impedance load drive circuit in series with a delay component. The second is a small current limited driver that is coupled in parallel to the series-connected delay and low-impedance driver. While the MOSFET is switching states, the small current limited driver is utilized. Upon a completed state transition, the parallel large low impedance driver is added. The delay component implements a delay before the large driver is switched on that is long enough to ensure it turns on only after the transition is complete, which corresponds to period 4 in the timing diagrams of FIGS. 2 and 3. The large low impedance driver then provides a low impedance pathway by which kickback charge can be sunk without it reaching the gate terminal of the MOSFET. According to some embodiments, the large low impedance driver is controlled using a digital on/off control that is regulated by the measured drain voltage of the MOSFET. This allows turning on the large buffer based on actual measurements that indicate when the transition between MOSFET states is complete. In some embodiments, the load switches can be integrated into the load driver circuit.

In light of the inadequacies of slew-rate control using open-loop, series resistor implementations, effective closed-loop solutions are preferred. However, the use of analog closed-loop slew-rate control implementations has several disadvantages. For example, in some cases, the load switch is a MOSFET that is external to the integrated circuit implementing the load driver circuit that drives the MOSFET's switching actions. In such situations, the operational parameters of the MOSFET load switch may be unknown or not known precisely. When the operational characteristics of a MOSFET load switch are not exactly known, attempts to manipulate the slew rate of such MOSFET using analog controls to moderate the gate voltage can result in unstable behavior. Consequently, a closed-loop, digital slew-rate control solution is desired.

Figure 5:
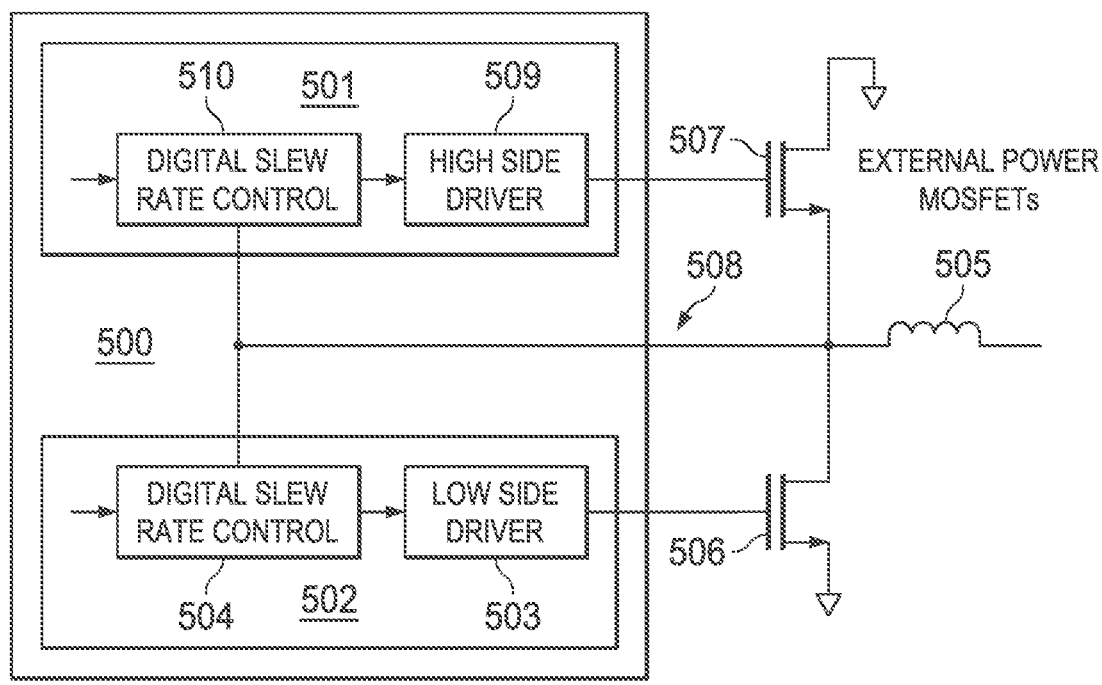
FIG. 5 shows a high-level depiction of a load drive circuit implementing slew-rate control according to an embodiment.

FIG. 5 depicts a general block diagram of an exemplary embodiment. In FIG. 5, the MOSFET load driver 500 is an integrated circuit comprised of a high-side load driver 501, which drives a high-side MOSFET 507, and a low-side load driver 502, which drives a low-side MOSFET 506. Each of the low-side and high-side drivers is comprised of two main components operating in series: a digital slew-rate control circuit and a load driver circuit. The low-side load driver 502 is comprised of a low side load driver circuit 503 and a low-side digital slew-rate controller 504. The high-side load driver 501 is comprised of a high-side load driver circuit 509 and a high-side digital slew-rate controller 510. Both the low-side load driver circuit 503 and the high-side load driver circuit 509 perform the conventional task of controlling the switching operations of the MOSFET.

Each of the digital slew-rate controllers, described in more detail below, receive feedback 508 reflecting the voltage change on the inductive load being driven via a high-side MOSFET 507 and a low-side MOSFET 506. This feedback input 508 signals the presence of changing voltages at the load output 505. As described in more detail below, this feedback information is utilized to digitally control the slew rate of the high-side MOSFET 507 and the low-side MOSFET 506 in a manner that increases overall efficiency by applying power to the current load as quickly as possible, while minimizing the amount of voltage spikes, kickback, or EMI that is generated. As described with respect to FIG. 4, certain embodiments utilize a large low impedance driver and a small current limited driver. Together, these drivers can provide an average output impedance that effectively moderates the rate of change of the gate voltage and, in turn, the drain voltage of the MOSFET. Some embodiments will manage the transitions between the two drivers via a digital slew-rate control module 510 that receives the drain voltage feedback 508 and uses this information to digitally switch the two available drivers as needed to moderate the slew rate of the drain voltages of the MOSFET switches to minimize any kickback.

In this dual MOSFET configuration, a current flows between a power supply, via the high-side MOSFET load switch 507 and the current load 505, and between the load 505 and ground via the load-side MOSFET load switch 506. In this manner, the high-side and low-side drivers can be alternately activated and deactivated in order to pulse current to a current load such as a motor. Embodiments may have multiple pairs of interoperating high-side and low-side drivers cooperating to power the current load. Other embodiments may not include both high-side and low-side drivers and could instead comprise a single driver powering a current load. In some embodiments, each pair of high-side and low-side drivers is comprised of an n-channel MOSFET load switch used in the low-side driver and a p-channel MOSFET load switch on the high-side driver. Other embodiments may utilize different combinations of n-channel and p-channel MOSFETs in each pair of high-side and low-side load switches.

Figure 6:
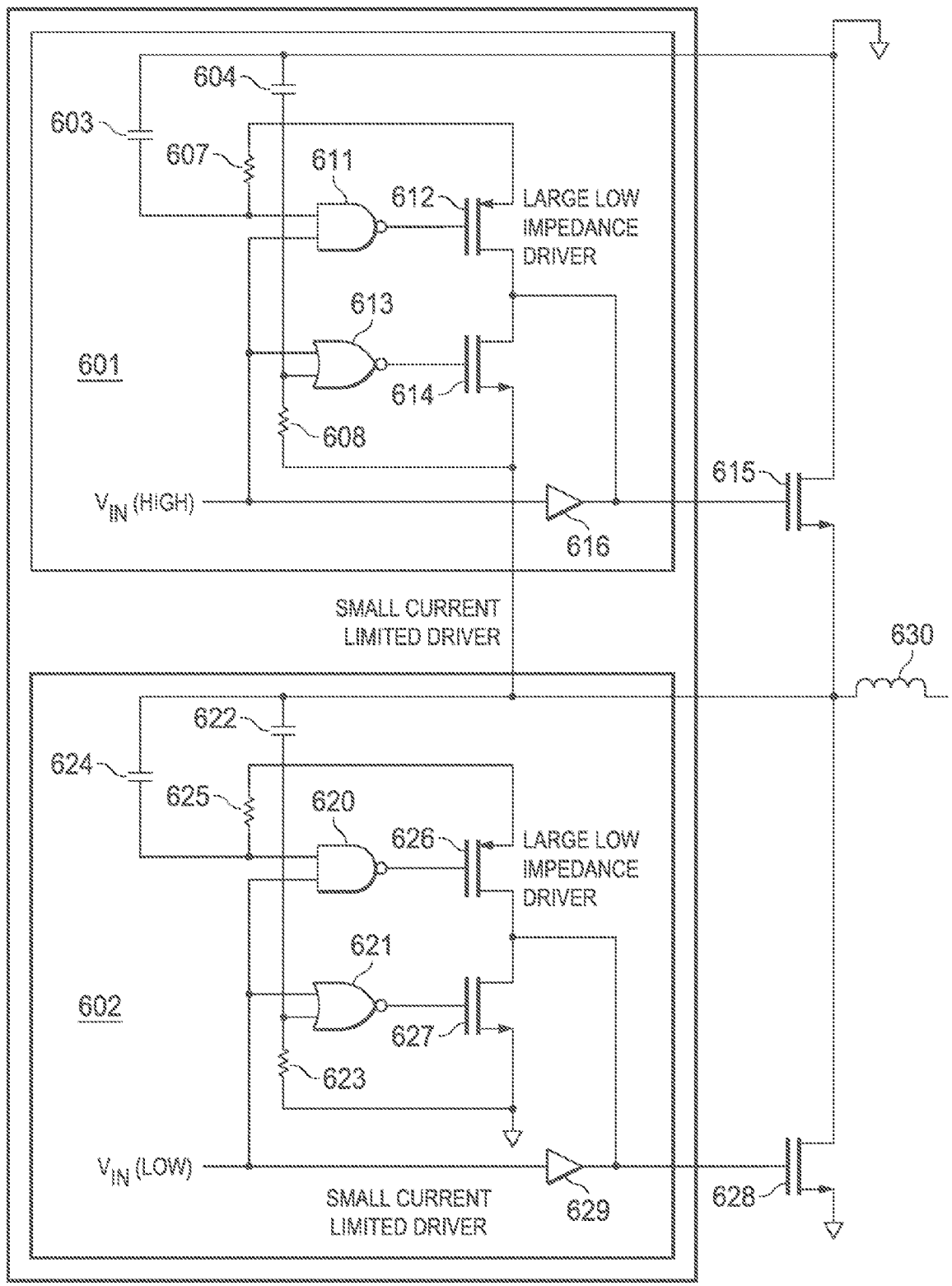
FIG. 6 shows a load drive circuit implementing slew-rate control according to an embodiment.

FIG. 6 shows an embodiment of a more detailed depiction of the high-side load driver 601 and low-side load driver 602. As described with respect to FIG. 5, each of these drivers is comprised of a digital slew-rate controller and a load driver circuit. With respect to the low-side driver, the load driver circuit is comprised of field-effect transistors 626 and 627, and small current limited driver 629, and corresponds to item 503 of FIG. 5. The low-side digital slew-rate controller, items 504 of FIG. 5, is comprised of the remaining components of the low-side load driver 602. The digital slew-rate controller and the load driver of the high-side driver are similarly formed by the illustrated components of the high-side driver 601.

The input signal for the high side driver, $V_{IN}$(HI) and the input signal for the low side driver $V_{IN}$(LOW) are conventional load driver inputs similar to the inputs observed in FIG. 2 and FIG. 3. With respect to the low side driver 602, the low-side input signal, $V_{IN}$(LOW), turns on/off the small current limited driver 629 and the large low impedance driver. Likewise, the high-side input signal, $V_{IN}$(HI), turns on/off the two drivers that comprise the high-side driver. The digital input signals generated by digital slew-rate controller 504 are based on the voltage change on the load, in particular the measured drain voltage of MOSFET 628 and source voltage of MOSFET 615. The digital input signals generated by digital slew-rate controller 504 turn off the large driver when the voltage on the load 630 changes too fast and turns back on the large driver if the voltage changes too slowly. In this manner, by turning on/off the large driver at an appropriate rate, they moderate the rate of change of the output voltage on the load 630.

Unlike open-loop slew-rate control mechanisms that make changes to the slew rate of an output signal without any knowledge of the actual values of the output signal, the invention utilizes a feedback pathway used to indicate the actual changes in the slew rate of the load voltage 630. This use of feedback allows more precise control of the rate of change of the load voltage, where the generation of the digital inputs to the load drivers accounts for the actual load. In the embodiment of FIG. 6, the feedback mechanism is implemented using a circuit pathway that connects both the high-side and low-side slew-rate controllers to the pathway powering the current load 630. In the embodiment of FIG. 6, this circuit pathway provides a shared feedback pathway that is utilized by both the high-side digital slew-rate controller 601 and the low-side digital slew-rate controller 602.

For both the high-side digital slew-rate controller 601 and the low-side digital slew-rate controller 602, a capacitor and a resistor are paired to control the operation of the digital logic gates that comprise the load driver circuit. To determine whether any adjustments will be made to the slew-rate controlled output signal, the capacitive feedback signal is provided as an input to pairs of logical gates in each slew-rate controller. If this feedback signal surpasses the threshold for trigging the input to the logical gate, the gates change states such that voltage adjustments result that either increases/decreases or stalls the rate of change in the slew-rate controlled output signal. The resistors 607, 608, 623, and 625 serve to set the reference slew rate by charging or discharging the capacitors, such that the voltage on the digital gates inputs are triggered to switch back in the other direction. In this manner, the capacitors and resistors are used to digitally moderate the slew rate of the load voltage based on feedback indicating the measured load voltage values.

With respect to the high-side digital slew-rate controller 601, one of the pair of logical gates used to modify the slew-rate controlled output signal is a NAND gate 611. This NAND gate 611 receives a feedback signal via capacitor 603 as one input and the high-side input voltage $V_{IN}$(HIGH) as the other input. When $V_{IN}$(HI) is set high, the large driver 612 is turned on, since the feedback signal is high due to the resistor 607. When the voltage on 630 rises too fast, the feedback capacitor 603 forces the input on 611 below the threshold, which turns off 612. This slows down the slew rate on 630. If the slew rate is too slow, the resistor 607 will discharge capacitor 603, and this will turn on the transistor 612 again, which will increase the slew rate on 630.

The second logical gate in the pair of logical gates present within the high-side digital slew-rate controller 601 that is used to modify the slew-rate controlled output signal is a NOR gate 613. This NOR gate 613 receives the feedback signal via capacitor 604 as one input and the high-side input voltage $V_{IN}$(HIGH) as the other input. The output of the NOR gate 613 is used to control the gate terminal of a field-effect transistor 614. When $V_{IN}$(HIGH) is set low, the large driver 614 is turned on, since the feedback signal is low due to the resistor 608. When the voltage on 630 falls too fast, the feedback capacitor 604 forces the input on 613 above the threshold, which turns off 614. This slows down the slew rate on 630. If the slew rate is too slow, the resistor 608 will discharge capacitor 604, and this will turn on the transistor 614 again, which will increase the slew rate on 630.

By sizing the capacitors and resistors to select the adequate slew rate, the high-side digital slew-rate controller 601 drives the gate terminal of MOSFET 615, such that damaging amounts of kickback are prevented from occurring, yet the gate voltage is increased to its final value as quickly as possible.

This feedback driven mechanism for adjusting the slew rate of the output signal of the high-side digital slew-rate controller 601 results in an output adjustment that can be considered a type of pulse-width modulation (PWM) digital signal. This digital output signal has periods where no voltage increases/decreases are made to the gate terminal of MOSFET 615, mixed with periods where voltage to the gate terminal is increased/decreased. Rather than making continuous slew-rate adjustments, as in conventional analog systems, this digital slew-rate control mechanism makes discrete slew-rate adjustments The relative durations of the periods where slew-rate adjustments are made will dictate the rate at which the gate terminal voltage is increased/decreased, which in turn dictates the rate at which the drain current is increased/decreased and current is provided to the load 630.

Working in conjunction with the high-side digital slew-rate controller 601, the low-side digital slew-rate controller 602 operates to allow current to flow from the load 630 to ground or from ground to the load. However, as with rapid changes in current flow to a load, allowing current to rapidly flow from the load to ground (or vice versa) can result in damaging amounts of EMI, especially in situations where the load has significant inductance such as a motor. Thus, the low-side digital slew-rate controller 602 operates to control the rate at which current flows from the load 630 to ground or vice versa. Like the high-side digital slew-rate controller 601, the low-side digital slew-rate controller 602 is comprised of a pair of logical gates that are configured to interoperate in generating a digital voltage adjustment that either increases/decreases or stalls the rate of change in the slew-rate controlled output signal.

With respect to the low-side digital slew-rate controller 602, one of the logical gates used to generate the slew-rate controlled output signal is a NAND gate 620. This NAND gate 620 receives a feedback signal via capacitor 624 as one input and the low-side input voltage $V_{IN}$(LOW) as the other input. The output of the NAND gate 620 is used to control the gate terminal of a field-effect transistor 626. When both the low-side input voltage and the feedback signal are high, the NAND gate 620 output is low, turning on 626. When $V_{IN}$(LOW) is set high, the large driver 626 is turned on, since the feedback signal is high due to the resistor 625. When the voltage on 630 falls too fast, the feedback capacitor 624 forces the input on 620 below the threshold, which turns off 626. This slows down the slew rate on 630. If the slew rate is too slow, the resistor 625 will discharge capacitor 624, and this will turn on the transistor 626 again, which will increase the slew rate on 630.

The second logical gate in the pair of logical gates present within the low-side digital slew-rate controller 602 used to modify the slew-rate controlled output signal is a NOR gate 621. This NOR gate 621 receives the feedback signal via capacitor 622 as one input and the low-side input voltage $V_{IN}$(LOW) as the other input. The output of the NOR gate 621 is used to control the gate terminal of a field-effect transistor 627. The output of the NOR gate 621 is high only when both the low-side input voltage and the feedback signal are low. In this case, the output of the NOR gate 621 causes the field-effect transistor 627 to be in an on state. In all other cases, the output of the NOR gate 621 is low, and the field-effect transistor 627 is in an off state. When $V_{IN}$(LOW) is set low, the large driver 627 is turned on since the feedback signal is low due to the resistor 623. When the voltage on 630 rises too fast, the feedback capacitor 622 forces the input on 621 above the threshold which turns off 627. This slows down the slew rate on 630. If the slew rate is too slow, the resistor 623 will discharge capacitor 622, and this will turn on the transistor 627 again, which will increase the slew rate on 630.

By sizing the capacitors and resistors to select the adequate slew rate, the low-side digital slew rate controller 602 drives the gate terminal of MOSFET 628 such that damaging amounts of kickback are prevented from occurring, yet increases the gate voltage to its final value as quickly as possible.

As with the high-side controller, this results in a set of PWM-like digital outputs that are used to control the slew rate of the output signal, with the relative durations of the adjustment periods dictating the rate at which the gate terminal voltage is increased/decreased, and the rate of change of the drain current is increased/decreased.

Figure 7:
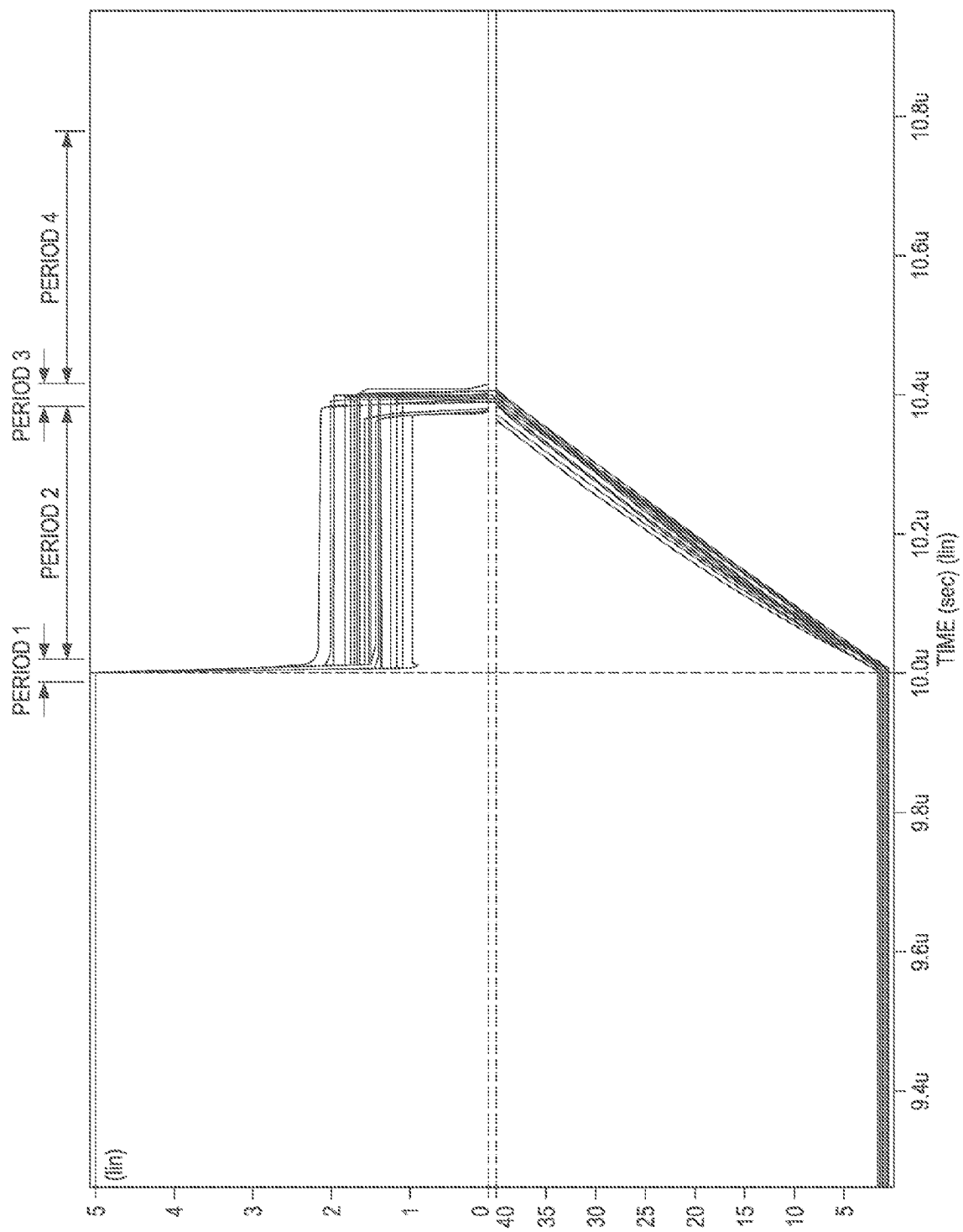
FIG. 7 shows a timing diagram generated using an embodiment.

Based on the operation of the described embodiment, improvements in slew-rate control have been demonstrated. FIG. 7 depicts a timing diagram generated using an embodiment similar to that depicted in FIG. 6. The timing diagram of FIG. 7 illustrates the profiles of gate voltage, $V_{GS}$, and drain voltage, $V_{DS}$, resulting from switching a MOSFET to an off state. The process by which a MOSFET is switched to an off state is described above with regard to FIG. 3. In FIG. 7, the gate voltage signal is depicted on top. As with the timing diagrams in FIGS. 2 and 3 described above, FIG. 7 is divided into four periods. The four periods of FIG. 7 reflect the same MOSFET operations described above with respect to FIGS. 2 and 3. However, the timing diagram of FIG. 7 illustrates improvements in slew-rate control compared to the off-state MOSFET switching illustrated in FIG. 3.

The improved gate voltage signal depicted in in the timing diagram of FIG. 7 begins with a significantly shortened period 1 when compared to the conventional load drive circuit of FIG. 3. This corresponds to a significantly shorted turn-off delay, which provides efficiency improvements compared to slew-rate control in conventional load drive circuits. As expected, the turn-off delay has not been eliminated entirely. The MOSFET's inherent internal capacitance must be discharged during period 1, thus resulting in an unavoidable delay in dropping the gate voltage even after the input voltage to the MOSFET is dropped.

Additional improvements provided by embodiments of the invention are reflected in period 2 of the timing diagram of FIG. 7. Compared to the conventional load drive circuit of FIG. 3, period 2 of FIG. 7 illustrates an extended length compared to other periods 1, 3 and 4. The slower, more controlled increase in drain voltage in FIG. 7 represents improved control of the drain current and, thus, improved control over the slew rate of the load drive circuit. As described above, a slower rate of increase in drain voltage results in less kickback and less EMI. Even though embodiments provide improved slew-rate control, embodiments do not adjust changes in the rate of powering the current load to be any slower than is necessary.

FIG. 7 also illustrates the ability of embodiments to consistently and accurately control slew rates under a variety of conditions. As described above, the performance of conventional series resistor systems depends significantly on the effect of various operating conditions on the series resistor and variances in MOSFET characteristics. The timing diagram of FIG. 7 depicts profiles of gate voltage, $V_{GS}$, and drain voltage, $V_{DS}$, obtained during simulations run under varying operating conditions. For example, FIG. 7 reflects simulations with different MOSFET load switch characteristics, load currents, supply voltages, and operating temperatures. As seen in FIG. 7, the profiles generated by embodiments under these various conditions showed minor variances. Under these same varying conditions, conventional systems would exhibit vastly different slew rates during at least period 2.

Figure 8:
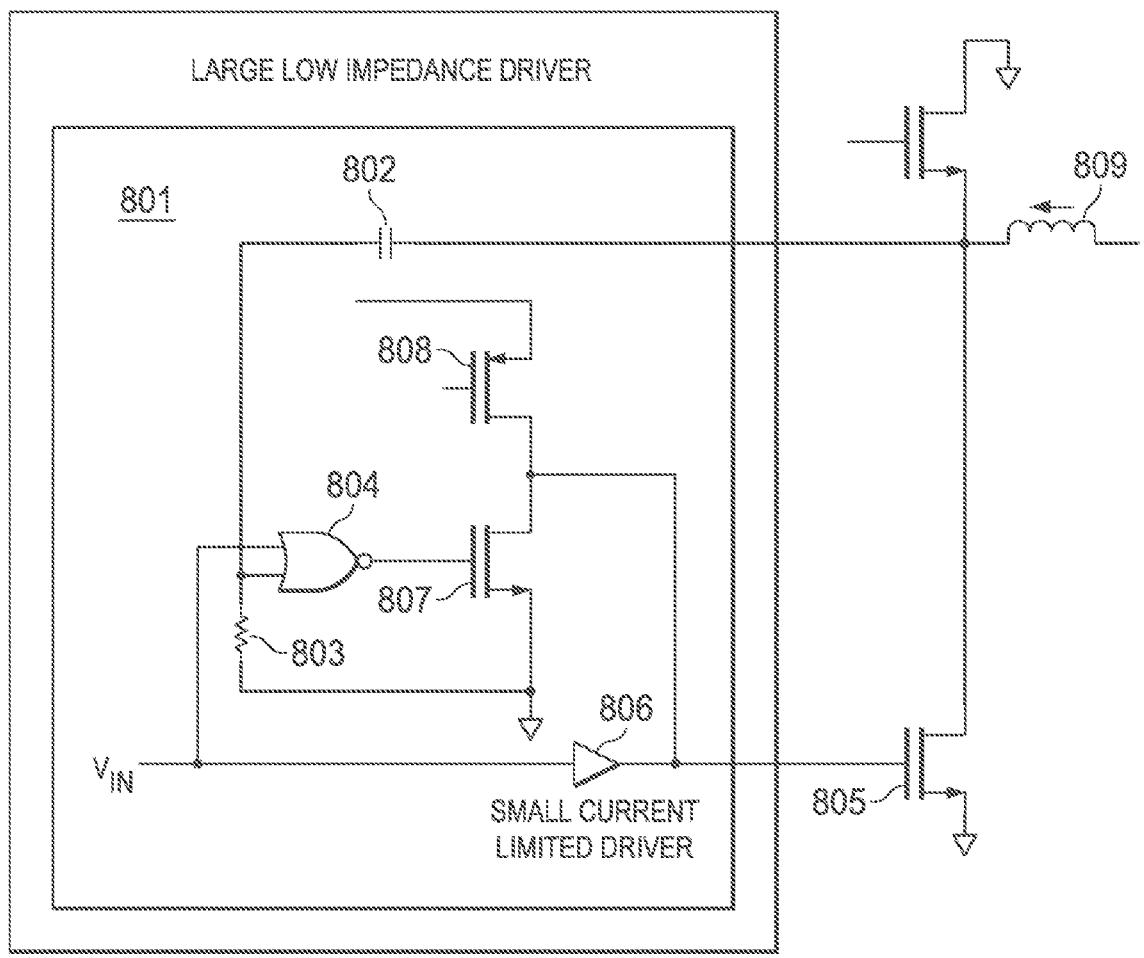
FIG. 8 depicts an embodiment with dual MOSFET load switches controlling power from high-side and low-side drivers.

As stated above, some embodiments may not include both high-side and low-side drivers, since certain current loads can be driven using a single phase driver. FIG. 8 depicts an embodiment with dual MOSFET load switches controlling power from high-side and low-side drivers. However, in the embodiment of FIG. 8, a digital slew-rate controller 801 is present only in the low-side driver. As with the embodiment of FIG. 6, feedback of the voltage on the current load 809 is used to control the slew rate of the MOSFET 805 that powers the current load 809. As before, a feedback capacitor 802 and a resistor 803 are used to set the slew rate. This feedback signal along with the input voltage, $V_{IN}$, provided by the controller are provided as inputs to pairs of logical gates that interoperate to provide digital adjustments to the slew-rate controlled output signal that is used to drive the gate terminal of the MOSFET 805. In FIG. 8, only one of the pair of logical gates is depicted, NOR gate 804, whose output controls a field-effect transistor 807.

The use of feedback information provides other advantages over conventional open-loop slew-rate control circuits, such as the series resistor solution described above. Conventional series resistor slew-rate control is dependent on the ability of a resistor, $R_{GATE}$, to moderate the rate of change in the gate voltage. One problem that results is that the operational performance of a resistor varies with temperature. Consequently, as the temperature changes in the system, the magnitude of the slew-rate adjustments made by the series resistor will also change. Embodiments of the invention that utilize feedback are able to account for the effects of temperature changes in the system and compensate for those effects. And, as described above, conventional systems are unable to account for variations in the tolerances of individual MOSFETs and load currents. The use of feedback again provides the ability for embodiments to compensate for these variations without the identity of any particular source of variations. Consequently, embodiment utilizing feedback significantly reduce the impact of these variables on the ability to accurately and precisely adjust slew rates. The improvement provided by embodiments over conventional systems is illustrated in period 2 of FIG. 7, which shows the uniformity of slew-rate control that can be provided by embodiments over a range of operating conditions.

Another advantage provided by embodiments of the invention is the ability to implement slew-rate control using a closed-loop solution that can accommodate the switching of both low and high currents. Since MOSFETs can be used to switch a large range of currents (from a few ampere to hundreds of ampere), power MOSFETs for controlling high currents are particularly prevalent in load switch applications used to power inductive current loads, such as motors. In analog closed-loop solutions, the use of feedback when high power is being switched requires the slew-rate control mechanism to be able to maintain fast switching operations, in order to avoid damage from high current feedback. The ability of embodiments to provide fast switching under a variety of operating conditions is again illustrated in the timing diagram of FIG. 7.

Further advantage can be provided by embodiments that allow the slew-rate control provided by the invention to be programmable. In some embodiments, the slew rate can be programmed through the use of programmable capacitors or resistors in the embodiment of FIG. 6, for example. For example, binary weighted capacitors can be used for capacitors 603, 604, 624, and/or 622, in order to allow the user to connect or disconnect portions of the capacitor to vary its capacitance. Similarly, binary weighted resistors can be used for resistors 603, 607, 624 and/or 623 that allow the resistance of these elements to be configured. By using configurable components, the slew rate can be changed.

What is claimed is:

1. An integrated circuit for driving a first load switch wherein the first load switch powers a current load, the integrated circuit comprising:
   a first digital slew-rate control unit for generating first control signals comprising a first digital logic gate receiving a feedback signal from the current load through a series connected first capacitor and first resistor wherein a node between the first resistor and the first capacitor is coupled with an input of the first digital logic gate, wherein the first digital slew-rate control unit generates the first control signals based on the feedback signal that indicates the rate of voltage change on the current load; and
   a first driver operated by the first control signals, wherein the first driver generates a slew-rate controlled output signal that operates the first load switch,
   wherein the first driver is modulated to generate the slew-rate controlled output signal during state transitions of the first load switch, wherein the modulation performs discrete slew-rate adjustments.

2. The integrated circuit of claim 1, wherein the first load switch is a MOSFET.

3. The integrated circuit of claim 1, further comprising a second driver that generates a constant output, wherein the first load switch is operated by the first driver and the second driver, and wherein the second driver generates a constant output during steady states of the first switch.

4. The integrated circuit of claim 3, wherein the first driver is a large low impedance driver and the second driver is a small current limited driver.

5. The integrated circuit of claim 3, wherein the first load switch is a low-side load switch and the integrated circuit further comprises:
   a second digital slew-rate control unit for generating second control signals comprising a second digital logic gate receiving the feedback signal from the current load through a series connected second resistor and second capacitor wherein a node between the second resistor and the second capacitor is coupled with an input of the second digital logic gate, wherein the second digital slew-rate control unit receives a second input signal and generates the second control signals based on the second input signal and the feedback signal that indicates the rate of voltage change on the load; and
   a third driver operated by the second control signals, wherein the third driver generates a slew-rate controlled output signal that operates the second load switch,
   a fourth driver that generates a constant output, wherein the second load switch is operated by the third driver and the fourth driver, and wherein the fourth driver generates a constant output during steady states of the second load switch, and wherein the third driver is modulated to generate a slew-rate controlled output during state transitions of the second load switch, wherein the third and fourth drivers are a high-side drivers.

6. The integrated circuit of claim 5, wherein the series connected second resistor and second capacitor are coupled between the load and a power supply.

7. The integrated circuit of claim 1, wherein the series connected first capacitor and first resistor are coupled between the load and a power supply common.

8. The integrated circuit of claim 7, wherein the first digital logic gate is a NOR gate and the first digital slew-rate control unit further comprises:
a NAND gate having a first input receiving the feedback signal and a second input receiving an input voltage signal, wherein the output of the NAND gate controls a p-channel field-effect transistor of the first driver; and
wherein a first input of the NOR gate receives the feedback signal through said series connected first resistor and first capacitor and a second input receives the input voltage signal, wherein the output of the NOR gate controls an n-channel field-effect transistor of the first driver, wherein the p-channel field-effect transistor and the n-channel field-effect transistor are coupled in series and a node between the p-channel field-effect transistor and the n-channel field-effect transistor provides an output of the first driver.

9. The integrated circuit of claim 1, wherein the modulation is performed by a digital output signal of the first digital slew-rate control unit such that there are periods where a voltage at the gate of the first load switch does not increase or decrease mixed with periods where voltage at the gate of the first load switch increases or decreases.

10. A slew-rate controlled load driving system comprising:
a first load switch for powering a current load;
a first digital slew-rate control unit that generates control signals, wherein the control signals are generated based on a feedback signal that indicates the rate of voltage change on the current load, wherein the feedback signal is fed to the first digital slew-rate control unit through a first capacitor and first resistor connected in series between the current load and a power supply common; and
a first load driver circuit operated by the control signals, wherein the first load driver circuit generates a modulated slew-rate controlled output voltage that operates the first load switch during state transitions of the first load switch, wherein the modulation is performed by a digital output signal of the first digital slew-rate control unit which comprises periods where no voltage increases or decreases at the gate of the first load switch are made mixed with periods where voltage increases or decreases at the gate of the first load switch are made.

11. The system of claim 10, wherein the first load switch is a MOSFET.

12. The system of claim 11, wherein the first digital slew-rate control unit and the first load driver circuit form a slew-rate control driver; and the system further comprises:
a non-control driver that generates a constant output, wherein the load switch is operated by the non-control driver and the slew-rate control driver, and wherein the slew-rate control driver generates a constant output during steady states of the load switch, and wherein the slew-rate control driver is pulse width modulated to generate the modulated slew-rate controlled output during state transitions of the first load switch.

13. The system of claim 12, wherein the slew-rate controlled driver is a large low impedance driver and the non-control driver is a small current limited driver.

14. The system of claim 10, wherein first digital slew-rate control unit and the first load driver circuit comprise a low-side driver, and the first load switch is a low-side load switch and the system further comprises:
a second digital slew-rate control unit for generating high-side control signals, wherein the second digital slew-rate control unit generates the high-side control signals based on the feedback signal that indicates the rate of voltage change on the current load, wherein the feedback signal is fed to the second digital slew-rate control unit through a second resistor and second capacitor connected in series between the current load and a power supply;
a second load driver circuit operated by the high-side control signals, wherein the second load driver circuit generates a slew-rate controlled output voltage that operates the second load switch, wherein the second load driver circuit and the second digital slew-rate control unit comprise a high-side driver.

15. The system of claim 10, wherein the first digital slew-rate control unit further comprises:
a NOR gate having a first input coupled with an input voltage and a second input coupled with a node between the first resistor and the first capacitor, wherein an output of the NOR gate controls an n-channel field-effect transistor of the first load driver circuit.

16. The system of claim 15, wherein the first digital slew-rate control unit further comprises:
a NAND gate having a first input receiving the feedback signal and a second input receiving the input voltage signal, wherein the output of the NAND gate controls a p-channel field-effect transistor of the first load driver circuit.

17. A method for controlling the slew rate of a first load switch, wherein the first load switch powers a current load, the method comprising:
providing a feedback signal via a first series connected resistor and capacitor to a first slew-rate control unit;
generating, via the first digital slew-rate control unit, first control signals, wherein the first digital slew-rate control unit generates the first control signals based on the feedback signal that indicates the rate of voltage change on the current load;
generating a slew-rate controlled output voltage via a first driver, wherein the first driver is operated by the first control signals; and
controlling the first load switch with the first driver, wherein during state transitions, the first driver is modulated by a digital output signal of the first digital slew-rate control unit such that there are periods where a voltage at the gate of the first load switch does not increase or decrease mixed with periods where voltage at the gate of the first load switch increases or decreases.

18. The method of claim 17, wherein the first load switch is a MOSFET, and the method further comprises:
applying the slew-rate controlled first output voltage to the gate terminal of the MOSFET.

19. The method claim 17, further comprising generating a constant output depending on a first input signal using a second driver and controlling the first load switch with the first and second driver.

20. The method of claim 19, wherein the first driver and the second driver are low-side drivers, and the first load switch is a low-side load switch, the method further comprising:
providing the feedback signal via a second series connected capacitor and resistor to a second slew-rate control unit;
generating, via the second digital slew-rate control unit, second control signals, wherein the second digital slew-rate control unit generates the second control signals based on the feedback signal that indicates the rate of voltage change on the current load;
generating a second slew-rate controlled output voltage via a third driver operated by the second signals, wherein the third driver is a high-side driver; and
generating a constant output by a fourth driver depending on a second input signal,
controlling a second load switch by the third driver and the fourth driver, wherein the third driver is modulated to generate a slew-rate controlled output during state transitions of the second load switch.

21. The method of claim 20, wherein the second series connected resistor and capacitor are coupled between the current load and a power supply.

22. The method of claim 17,
wherein the first series connected capacitor and resistor are coupled between the current load and a power supply common.

23. The method of claim 22, the method further comprising:
controlling a p-channel field-effect transistor via the output of a NAND gate of the first digital slew-rate control unit, wherein the NAND gate receives an input voltage signal at a first, terminal and wherein the NAND gate receives the feedback signal at a second terminal; and
controlling an n-channel field-effect transistor via the output of a NOR gate of the first digital slew-rate control unit, wherein the NOR gate receives the input voltage signal at a first terminal, and wherein the NOR gate receives the feedback signal through said first series connected capacitor and resistor at a second terminal.

* * * * *